(12) United States Patent
Yu et al.

(10) Patent No.: US 10,651,407 B2
(45) Date of Patent: May 12, 2020

(54) VERTICAL FIELD-EFFECT TRANSISTOR

(71) Applicants: University of Florida Research Foundation, Incorporated, Gainesville, FL (US); Nanoholdings, LLC, Rowayton, CT (US)

(72) Inventors: Hyeonggeun Yu, Raleigh, NC (US); Franky So, Cary, NC (US); Do Young Kim, Jenks, OK (US); Bhabendra K. Pradhan, Marietta, GA (US)

(73) Assignees: Nanoholdings, LLC, Rowayton, CT (US); University of Florida Research Foundation, Incorporated, Gainesville, FL (US)

(*) Notice: Subject to any disclaimer, the term of this patent is extended or adjusted under 35 U.S.C. 154(b) by 0 days.

(21) Appl. No.: 15/758,925

(22) PCT Filed: Sep. 9, 2016

(86) PCT No.: PCT/US2016/051034
§ 371 (c)(1),
(2) Date: Mar. 9, 2018

(87) PCT Pub. No.: WO2017/044800
PCT Pub. Date: Mar. 16, 2017

(65) Prior Publication Data
US 2018/0254419 A1      Sep. 6, 2018

Related U.S. Application Data

(60) Provisional application No. 62/217,568, filed on Sep. 11, 2015.

(51) Int. Cl.
*H01L 21/8234* (2006.01)
*H01L 51/10* (2006.01)
(Continued)

(52) U.S. Cl.
CPC .... *H01L 51/105* (2013.01); *H01L 21/823487* (2013.01); *H01L 27/1443* (2013.01);
(Continued)

(58) Field of Classification Search
CPC ................... H01L 21/8232; H01L 29/0856
See application file for complete search history.

(56) References Cited

U.S. PATENT DOCUMENTS 6,037,718 A   3/2000   Nagami
7,261,852 B2  8/2007   Rinzler et al.
(Continued)

FOREIGN PATENT DOCUMENTS

CN       102629665 A1    8/2012
WO    WO 2014/085410 A1  6/2014
(Continued)

OTHER PUBLICATIONS

Invitation to Pay Additional Fees for International Application No. PCT/US2016/051039 dated Oct. 26, 2016.
(Continued)

*Primary Examiner* — Cheung Lee
(74) *Attorney, Agent, or Firm* — Wolf, Greenfield & Sacks, P.C.

(57) ABSTRACT

A vertical field-effect transistor is provided, comprising a first electrode, a porous conductor layer formed from a layer of conductive material with a plurality of holes extending through the conductive material disposed therein, a dielectric layer between the first electrode and the porous conductor layer, a charge transport layer in contact with the porous conductor layer, and a second electrode electrically connected to the charge transport layer. A photoactive layer may be provided between the dielectric layer and the first electrode. A method of manufacturing a vertical field-effect transistor may also be provided, comprising forming a
(Continued)

dielectric layer and depositing a conductor layer in contact with the dielectric layer, wherein one or more regions of the dielectric layer are masked during deposition such that the conductor layer includes a plurality of pores that extend through the conductor layer.

22 Claims, 13 Drawing Sheets

(51) Int. Cl.
  *H01L 51/05*   (2006.01)
  *H01L 27/144*   (2006.01)
  *H01L 29/08*   (2006.01)
  *H01L 29/417*   (2006.01)
  *H01L 27/28*   (2006.01)
  *H01L 51/00*   (2006.01)
  *H01L 51/42*   (2006.01)
  *H01L 51/44*   (2006.01)
  *H01L 27/30*   (2006.01)

(52) U.S. Cl.
  CPC ........ *H01L 27/286* (2013.01); *H01L 29/0847* (2013.01); *H01L 29/41733* (2013.01); *H01L 51/0021* (2013.01); *H01L 51/057* (2013.01); *H01L 51/0525* (2013.01); *H01L 27/283* (2013.01); *H01L 27/305* (2013.01); *H01L 51/0023* (2013.01); *H01L 51/0046* (2013.01); *H01L 51/0558* (2013.01); *H01L 51/426* (2013.01); *H01L 51/441* (2013.01)

(56) References Cited

U.S. PATENT DOCUMENTS

| | | |
|---|---|---|
| 7,776,444 B2 | 8/2010 | Rinzler et al. |
| 7,972,699 B2 | 7/2011 | Rinzler et al. |
| 8,232,561 B2 | 7/2012 | Rinzler et al. |
| 8,759,830 B2 | 6/2014 | Tessler et al. |
| 9,214,644 B2 | 12/2015 | Rinzler et al. |
| 10,033,946 B2 | 7/2018 | Sarusi et al. |
| 2004/0197546 A1 | 10/2004 | Rinzler et al. |
| 2005/0199894 A1 | 9/2005 | Rinzler et al. |
| 2005/0218412 A1 | 10/2005 | Kido et al. |
| 2006/0099448 A1 | 5/2006 | Lu et al. |
| 2007/0141345 A1 | 6/2007 | Rinzler et al. |
| 2008/0268248 A1 | 10/2008 | Jang et al. |
| 2009/0302310 A1 | 12/2009 | Rinzler et al. |
| 2010/0237336 A1 | 9/2010 | Rinzler et al. |
| 2010/0272981 A1 | 10/2010 | Rinzler et al. |
| 2011/0232731 A1 | 9/2011 | Namkoong et al. |
| 2012/0097949 A1 | 4/2012 | Tessler et al. |
| 2012/0211749 A1 | 8/2012 | Fukuoka et al. |
| 2012/0271984 A1* | 10/2012 | Ohmaru ............ G11C 14/0054 711/103 |
| 2012/0305061 A1 | 12/2012 | O'Brien et al. |
| 2013/0215496 A1 | 8/2013 | Ban et al. |
| 2013/0240842 A1 | 9/2013 | Rinzler et al. |
| 2014/0111652 A1 | 4/2014 | So et al. |
| 2014/0263945 A1 | 9/2014 | Huang et al. |
| 2015/0008390 A1 | 1/2015 | Lewis et al. |
| 2015/0021621 A1 | 1/2015 | Adekore et al. |
| 2015/0171149 A1 | 6/2015 | So et al. |
| 2019/0043925 A1 | 2/2019 | So et al. |

FOREIGN PATENT DOCUMENTS

| | | |
|---|---|---|
| WO | WO 2014/085410 A8 | 7/2014 |
| WO | WO 2015/066213 A1 | 5/2015 |

OTHER PUBLICATIONS

International Search Report and Written Opinion for International Application No. PCT/US2016/051039 dated Jan. 6, 2017.
International Preliminary Report on Patentability for International Application No. PCT/US2016/051039 dated Mar. 22, 2018.
Invitation to Pay Additional Fees for International Application No. PCT/US2016/051034 dated Oct. 26, 2016.
International Search Report and Written Opinion for International Application No. PCT/US2016/051034 dated Jan. 26, 2017.
International Preliminary Report on Patentability for International Application No. PCT/US2016/051034 dated Mar. 22, 2018.
Extended European Search Report for European Application No. 16845154.0 dated Apr. 4, 2019.
Liu et al., Carbon-Nanotube-Enabled Vertical Field Effect and Light-Emitting Transistors. Advanced Materials. 2008;20(19):3605-9. doi: 10.1002/adma.200800601.

\* cited by examiner

VERTICAL FIELD-EFFECT TRANSISTOR

CROSS-REFERENCE TO RELATED APPLICATIONS

This application is a National Phase Entry of international PCT patent application No. PCT/US2016/051034, entitled "VERTICAL FIELD-EFFECT TRANSISTOR" filed on Sep. 9, 2016, which claims priority to and the benefit of U.S. Provisional Application Ser. No. 62/217,568, entitled "VERTICAL FIELD-EFFECT AND LIGHT-EMITTING TRANSISTOR" filed on Sep. 11, 2015. The entire contents of these applications are incorporated herein by reference in their entirety.

BACKGROUND

Metal-oxide-semiconductor field-effect transistors (MOSFETs) are key components in microelectronic devices. With technological improvements, reductions of the source-drain channel lengths have significantly enhanced the power consumptions as well as the switching speeds. However, short channel effects such as hot-carrier transports may cause low on/off ratios and non-saturated output currents of the transistor. In addition, high resolution-patterning processes are required to define such short channel lengths, which may significantly increase the fabrication cost.

SUMMARY

Some aspects provide a vertical field-effect transistor, comprising a first electrode, a porous conductor layer formed from a layer of conductive material with a plurality of holes extending through the conductive material disposed therein, a dielectric layer between the first electrode and the porous conductor layer, a charge transport layer in contact with the porous conductor layer, and a second electrode electrically connected to the charge transport layer.

Some aspects provide a method of manufacturing a vertical field-effect transistor, the method comprising forming a dielectric layer, and depositing a conductor layer over the dielectric layer, wherein one or more regions of the dielectric layer are masked during deposition such that the conductor layer includes a plurality of pores that extend through the conductor layer.

Some aspects provide a method of operating a vertical field-effect transistor comprising a first electrode, a dielectric layer, a porous conductor layer, a charge transport layer in contact with the porous conductor layer, and a second electrode, the dielectric layer being between the first electrode and the porous conductor layer and the charge transport layer being between the porous conductor layer and the second electrode, the method comprising applying a first bias voltage from the porous conductor layer to the first electrode, applying a second bias voltage from the porous conductor layer to the second electrode, the second bias voltage having a sign opposite to a sign of the first bias voltage, wherein holes injected at the first electrode produce free electrons in the charge transport layer with a conversion efficiency exceeding 1000%.

The foregoing is a non-limiting summary of the invention, which is defined by the attached claims.

DETAILED DESCRIPTION

Figure 1:
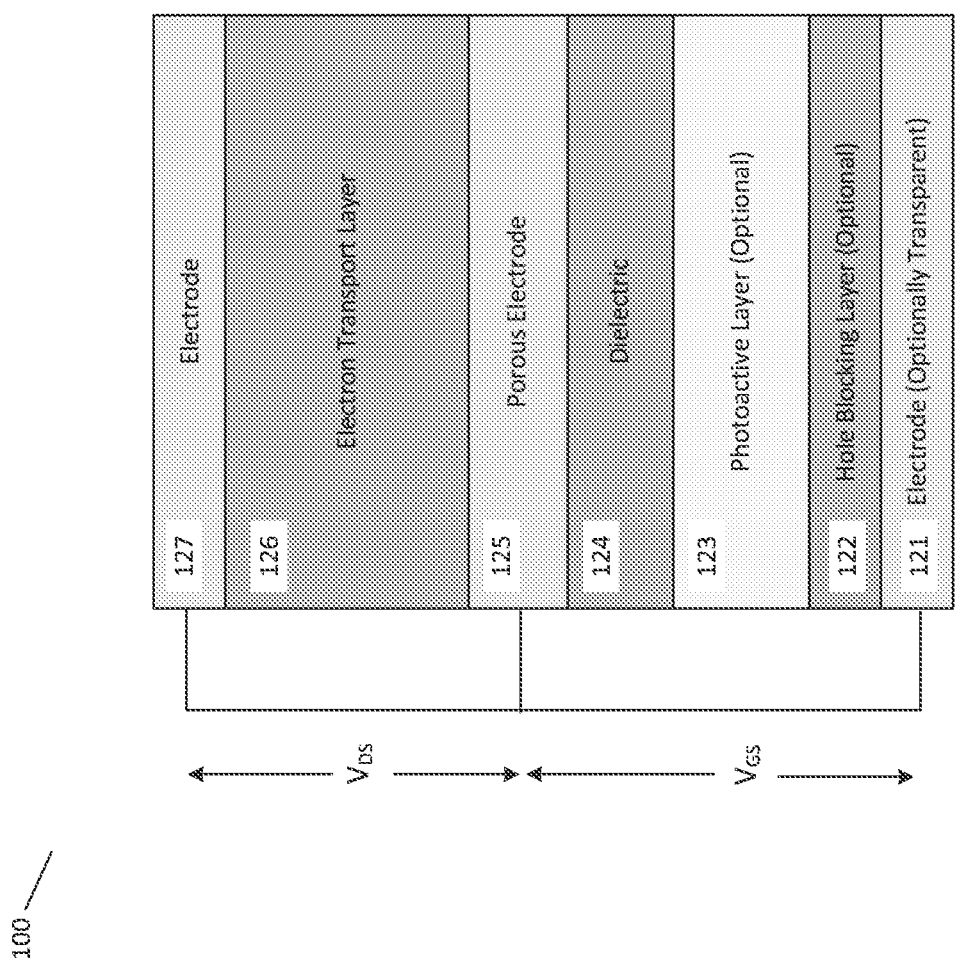
FIG. 1 is a schematic diagram of an illustrative vertical field effect transistor device, according to some embodiments.

Embodiments of the present invention are directed to a vertical field-effect transistor, which may optionally comprise a high gain photodetector. The inventors have recognized and appreciated that by combining a dielectric layer and a porous conductive layer, a high current gain may be produced as a result of charge accumulation at the interface between the photoactive layer and the dielectric layer, thereby leading to injection of electrons from the porous conductive layer at high gain. The porous conductive layer may be formed from a layer of a semiconductor or a conductor such that holes (or pores) extend through the layer. The porous conductive layer may thereby be formed using traditional semiconductor fabrication techniques, while as described below facilitating a high gain within the transistor device.

In some embodiments, free charges in the dielectric layer may be generated from photons incident to a photoactive layer. In some embodiments, free charges in the dielectric layer may be produced as a result of a current being provided to a gate electrode of the transistor. In either case, an output current may be generated from electrons injected from the porous conductive layer into a charge transport layer (e.g., an electron transport layer) adjacent to the conductive layer. In this manner, the porous conductive layer modulates the output current. The porous conductive layer may be adjacent to the dielectric layer, which may in turn be adjacent to a photoactive layer or a gate electrode.

Without a bias voltage applied to the dielectric layer, there may be a Schottky barrier (or other potential energy barrier) at the interface between the porous conductive layer and the electron transport layer sufficiently high to substantially block electron injection into the electron transport layer. When a bias voltage is applied across the dielectric layer and porous conductive layer, electrons may accumulate at the interface between the dielectric and electron transport layers (i.e., in the region of the pores of the conductive layer). This may reduce the Schottky barrier at the interface between the porous conductive layer and the electron transport layer to some degree, yet the field effect may be small due to the presence of the dielectric layer and, in some embodiments, the dielectric properties of the photoactive layer.

In embodiments that include a photoactive layer, when the photoactive layer is illuminated with photons, and when a bias is applied across the photoactive layer, dielectric layer and porous conductive layer, holes generated in the photoactive layer may accumulate at the interface between the photoactive layer and the dielectric layer. The accumulation of holes may, via the field effect, reduce the potential energy barrier in the region of the pores of the conductive layer such that electrons are readily injected from the conductive layer into the electron transport layer. In effect, the pores are used to modulate the injection of electrons from the porous conductive layer into the electron transport layer by providing regions having lower Schottky barrier heights due to the field effect of the accumulated holes. According to some embodiments, a vertical field-effect transistor as discussed herein may have a photon to electron gain of between 1000% and 10,000%, or between 10,000% and 100,000%, or between 100,000% and 1,000,000%.

In embodiments that do not include a photoactive layer, current flow from the gate electrode may result in hole accumulations at the gate electrode. These holes exert a field-effect to generate electron accumulations at the interface between the dielectric layer and at the pores of the conductive layer. Thus the potential energy barrier in the region of the pores of the conductive layer may be reduced such that electrons are readily injected from the conductive layer into the electron transport layer. In effect, the pores are used to modulate the injection of electrons from the porous conductive layer into the electron transport layer by providing regions having lower Schottky barrier heights due to the field effect of the accumulated holes. According to some embodiments, a vertical field-effect transistor not including a photoactive layer may have an electron to electron gain of between 1000% and 10,000%, or between 10,000% and 100,000%, or between 100,000% and 1,000,000%.

The inventors have recognized and appreciated that such a vertical field-effect transistor may provide an input to output gain with a fast dynamic response. In particular, the vertical field-effect transistor may produce a high photon to electron gain in embodiments that include a photoactive layer, or a high transconductance in an embodiment when a current is supplied to the gate electrode. In comparison, while some infrared organic or colloidal quantum dot (CQD) photodetectors have reported acceptable photon to electron gains, such gains are due to charge trapping which have an inherently slow dynamic response. In contrast, a vertical field-effect transistor including a photoactive layer as described herein may produce a high photon to electron gain as a result of a capacitive gating effect, which produces a faster dynamic response.

According to some embodiments, conventional lithography processes may be used to produce the vertical field-effect transistor described herein, allowing the device to be fabricated using well-understood techniques. In particular, the porous conductive layer may be readily formed via conventional techniques and without special processing. A vertical field-effect transistor as described herein may be used in any suitable device that comprises transistors, such as thin film transistor (TFT) applications. Embodiments of the vertical field-effect transistor that include a photoactive layer may be for instance used in image sensors or in any other application that may utilize a photosensitive transistor.

FIG. 1 is a schematic diagram of an illustrative vertical field-effect transistor (VFET) 100, according to some embodiments. The device includes a gate electrode 121, a dielectric layer 124, a source electrode 125, an electron transport layer 126, and a drain electrode 127. During operation, there is a bias voltage $V_{GS}$ applied from the porous electrode 125 to the transparent electrode 121, and a bias voltage $V_{DS}$ applied from the porous electrode 125 to the electrode 128. The sign of each bias voltage may be the same, or the bias voltages may have a different sign (e.g., both electrodes 121 and 128 may be at a lower potential than electrode 125, or may both be at a higher potential).

The device optionally includes a photoactive layer 123 on which photons may be incident after passing through electrode 121 having transparency. Irrespective of whether electron injection is produced as a result of photocurrent in an optional photoactive layer and/or via a current drawn from gate electrode 121, the electrons are injected from the porous electrode 125 into the electron transport layer 126 (via a process to be described below). While electrode 125 is described as being "porous," this generally refers to a solid layer including intentionally created openings (such as, but not limited to pores or holes) that allow injection of electrons as described herein.

Figures 2A, 2B:
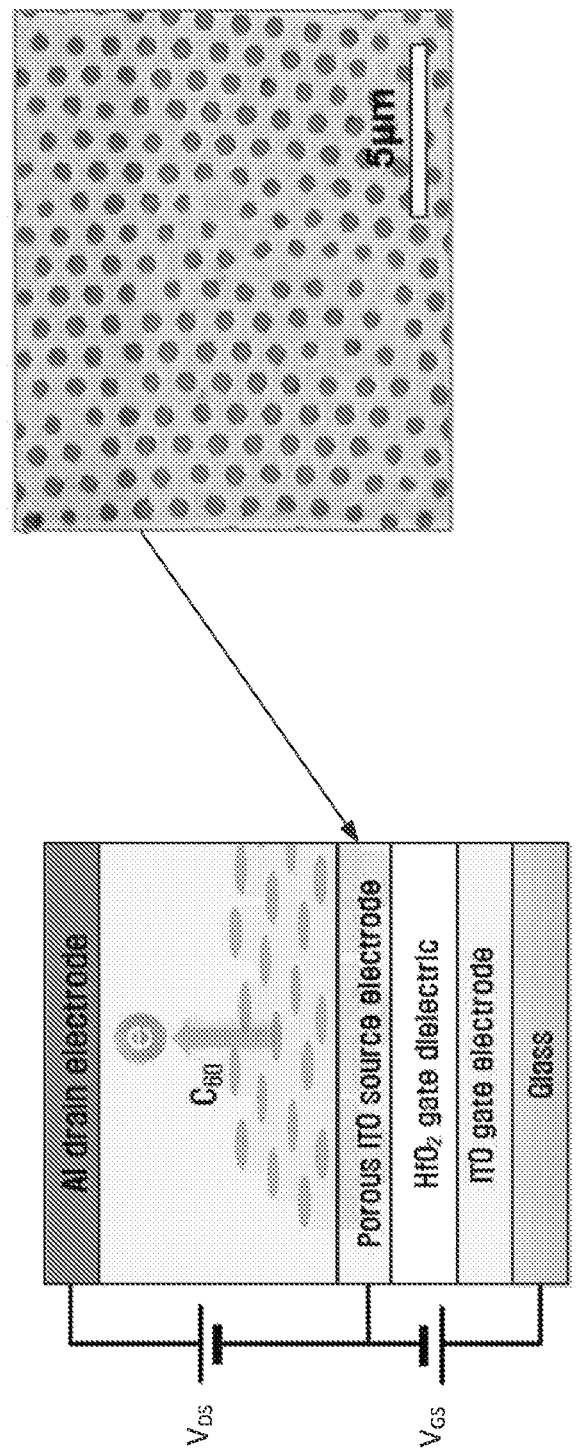
FIG. 2(a) is a schematic diagram of an illustrative VFET device, according to some embodiments.
FIG. 2(b) depicts pores of an illustrative porous ITO electrode of the VFET device shown in FIG. 2(a)

FIG. 2a is a schematic diagram of an illustrative VFET device, according to some embodiments. FIG. 2a is an example of a vertical, thin film transistor that could be made and operated as discussed below. In the example of FIG. 2a, $HfO_2$ is used as the dielectric layer, ITO is used as the gate electrode, and a porous ITO layer is used as the source electrode of the VFET. Any suitable electron transport material may be used in the VFET device, and $C_{60}$ is one such material that exhibits a desirably high electron mobility and provides a suitable energy barrier at the interface with the ITO source layer. In some embodiments, the dielectric layer may be a high-κ dielectric (of which $HfO_2$ is provided in the example of FIG. 2a as one possible dielectric meeting this description). A high-κ dielectric is a dielectric having a dielectric constant higher than that of Silicon Dioxide.

According to some embodiments, the energy barrier at the interface with the ITO source layer is between 0.2 eV and 1 eV, such as between 0.4 eV and 0.8 eV, such as 0.6 eV. According to some embodiments, the porous conductor layer may undergo a UV ozone treatment to increase its work function and thereby form a high Schottky barrier with respect to the $C_{60}$ layer (e.g., from 4.1 eV to 5.3 eV).

FIG. 2b is a Scanning Electron Microscope (SEM) image of an exemplary porous ITO film (~45 nm thickness), which includes a plurality of pores that extend through the source electrode (e.g., ITO) layer. In the example of FIG. 2b, the pore diameters are around 0.8 μm, and the scale bar represents 5 μm. According to some embodiments, pore diameters may each be between 0.1 μm and 10 μm, such as between 0.5 μm and 2 μm. It will be appreciated that, while the diameter of each pore may each be within this range, the pores may exhibit a range of diameters in the source conductor layer. According to some embodiments, the average pore diameter is between 0.1 μm and 10 μm, such as between 0.5 μm and 2 μm. The fraction of the surface area of the source conductor layer in which a pore is present may in some embodiments be between 40% and 60%, such as around 50%.

Figure 3:
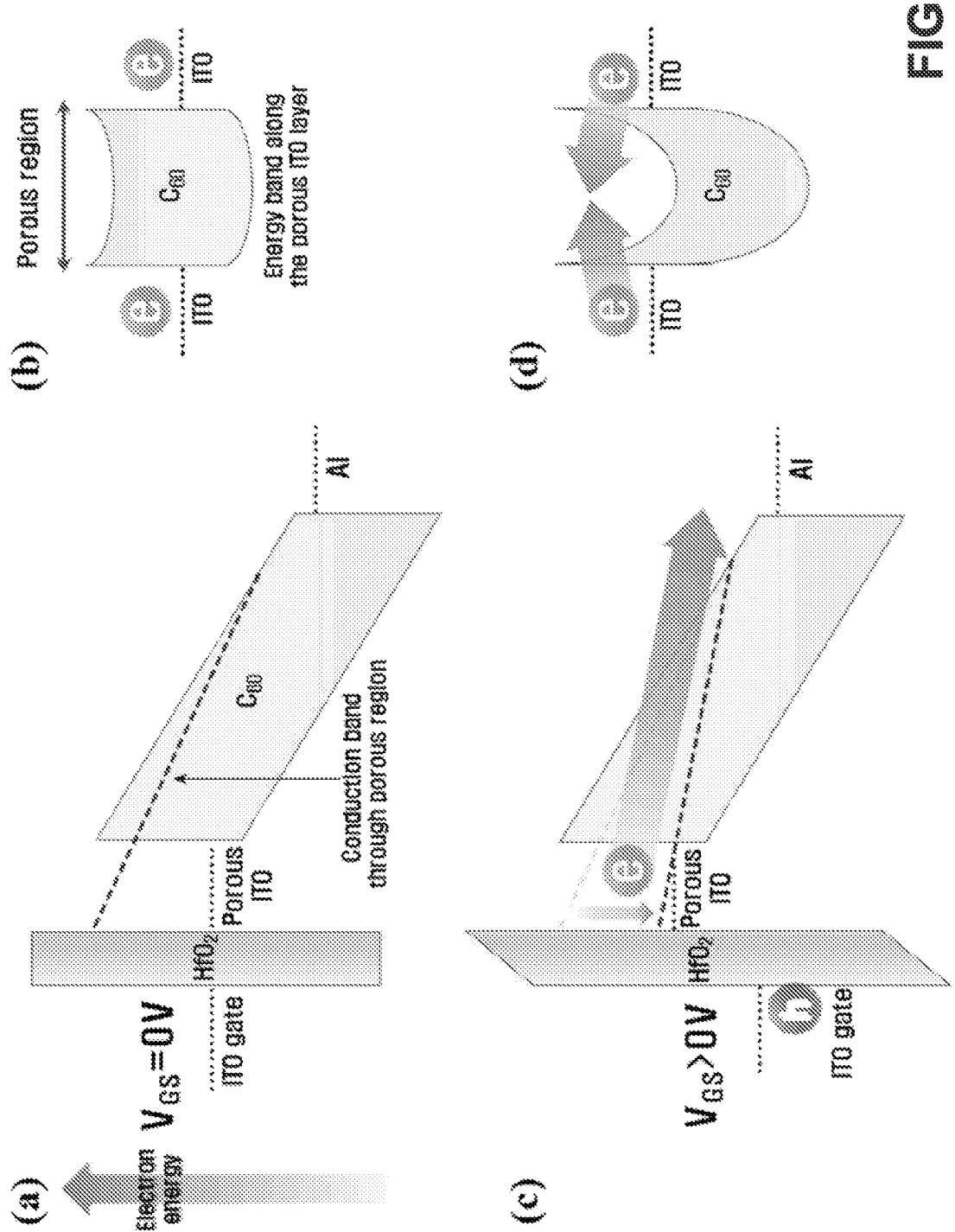
FIGS. 3(a)-3(d) illustrate schematic band diagrams explaining the underlying theory of the VFET shown in FIG. 2(a), according to some embodiments.

FIGS. 3(a)-3(d) illustrate the schematic band diagrams to explain the underlying mechanism of the VFET shown in FIG. 2a. Under zero gate bias (but with a non-zero drain source-bias) (FIG. 3a), electron injection from the porous ITO source electrode to the $C_{60}$ channel layer is blocked due to the large electron injection barrier at the interface. The black dash line represents the lowest unoccupied molecular orbital (LUMO) level of the $C_{60}$ layer at the center of a pore where $C_{60}$ is directly contacted with the $HfO_2$ gate dielectric layer. FIG. 3(b) illustrates the lateral band diagram of the porous ITO/$C_{60}$ junction in the lateral direction.

Under a positive gate bias VGS>0, as shown in FIG. 3(c), hole accumulations at the ITO gate electrode exert a field-effect to generate electron accumulations at the $HfO2/C_{60}$ interface in porous ITO regions. Hence, a band bending occurs in the $C_{60}$ layer and the lateral Schottky barrier width at the porous ITO/C60 interface is significantly reduced than the case shown in the FIG. 3(a). Subsequently, electron injection from ITO to $C_{60}$ is substantially increased as shown in the FIG. 2(d).

Figure 4:
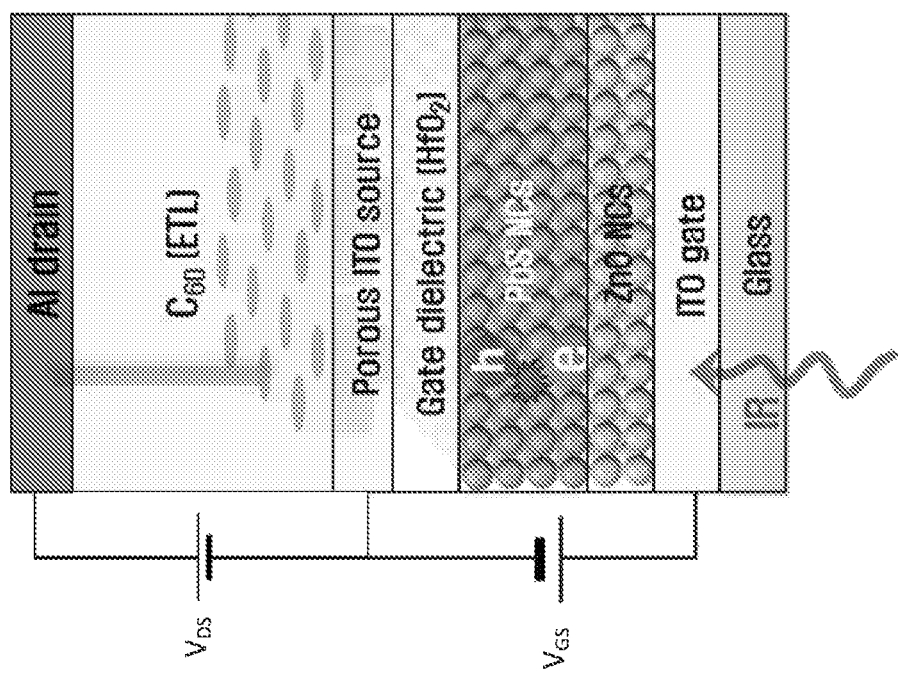
FIG. 4 is a schematic diagram of an illustrative VFET device including a photoactive layer, according to some embodiments.

FIG. 4 is a schematic diagram of an illustrative VFET device including a photoactive layer, according to some embodiments. In the example of FIG. 4, the photoactive gate consists of a solution-processed quantum-dot (PbS) layer inserted as an IR sensitizing gate between the ITO gate electrode and the $HfO_2$ gate dielectric layer. During operation, IR photons impinging upon the PbS layer through the ITO gate electrode generate photo-carriers, inducing a strong field-effect in the region where an electron transport layer (ETL) formed from $C_{60}$ is in contact with the porous ITO source electrode and the $HfO_2$ gate dielectric layer, modulating electron injection from the ITO source electrode to the $C_{60}$ channel layer. According to some embodiments, the porous conductor layer may undergo a UV ozone treatment to increase its work function and thereby form a high Schottky barrier with respect to the $C_{60}$ layer (e.g., from 4.1 eV to 5.3 eV).

FIGS. 5(a)-5(f) illustrate the schematic band diagrams to explain the underlying mechanism of the illustrative VFET device shown in FIG. 4. Under zero gate bias (but with a non-zero drain source-bias) and no IR illumination (FIG. 5a), electron injection from the porous ITO source electrode to the $C_{60}$ channel layer is blocked due to the large electron injection barrier at the interface. The black dash line represents the lowest unoccupied molecular orbital (LUMO) level of the $C_{60}$ layer at the center of a pore (which is marked ★) where $C_{60}$ is directly contacted with the $HfO_2$ gate dielectric layer.

Figure 5:
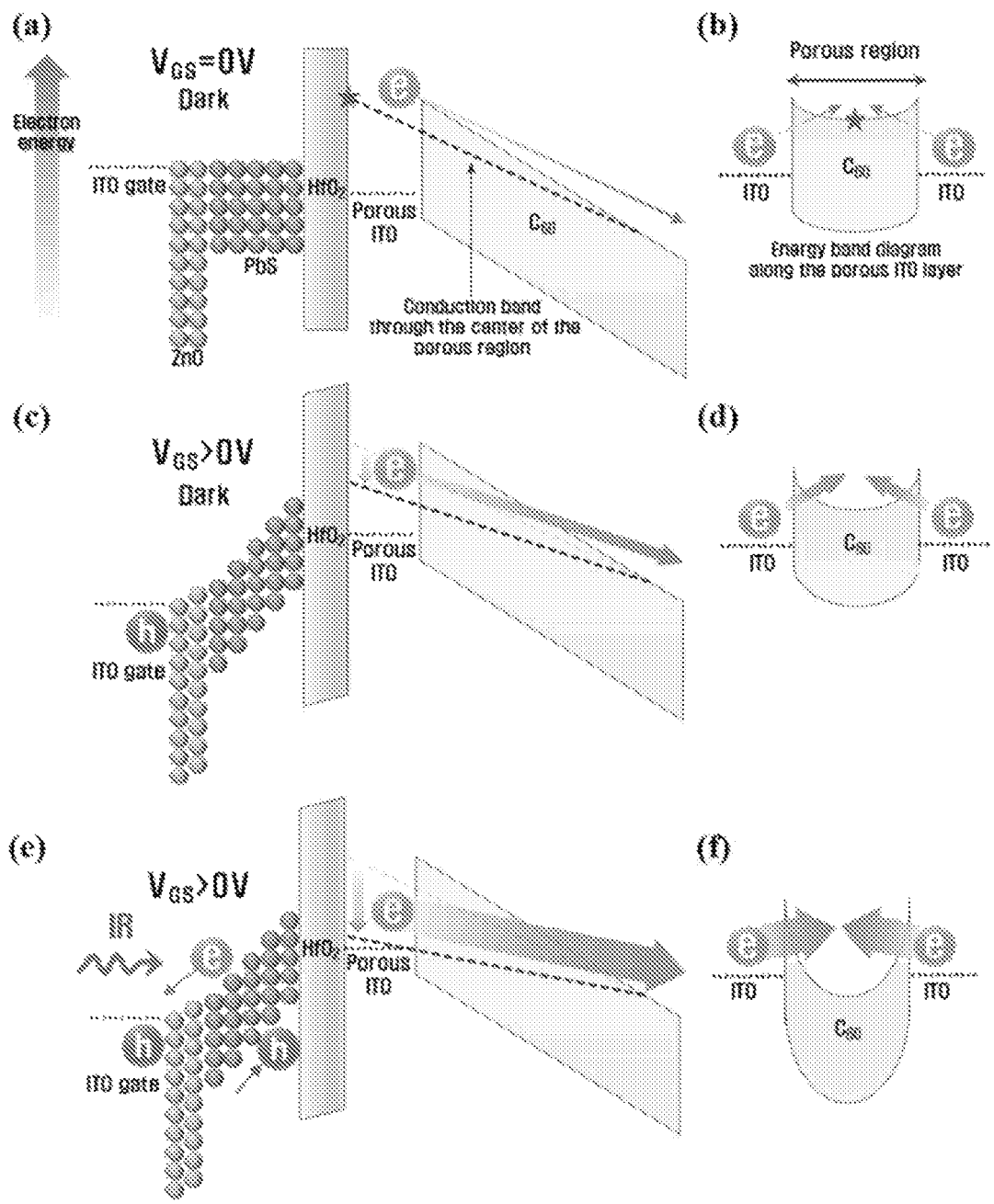
FIGS. 5(a)-5(f) illustrate schematic band diagrams explaining the underlying theory of the vertical IR phototransistor shown in FIG. 4, according to some embodiments.

FIG. 5(b) illustrates the lateral band diagram of the porous ITO/$C_{60}$ junction in the lateral direction. Since, as shown in FIG. 4, a reverse source-drain bias is applied to the ITO/$C_{60}$ Schottky junction, the dark current is low under zero gate bias. Under a positive gate bias with no IR illumination, as shown in FIG. 5(c), the solution-processed ZnO nanocrystal (NC) hole blocking layer with a deep ionization potential (=7.6 eV) blocks the injection of holes from the ITO gate electrode while attracting electrons to the $HfO_2/C_{60}$ interface in the porous ITO region. As a result of electron accumulation, band bending of the $C_{60}$ layer occurs where it is in contact with the porous ITO source electrode and the $HfO_2$ dielectric layer. Subsequently, the Schottky barrier width of the lateral ITO/$C_{60}$ interface is reduced, as shown in FIG. 5(d). However, the field-effect is not strong because of the thick gate dielectric stack (e.g., ZnO+PbS+$HfO_2$), and hence the increase in dark current is very small. In some embodiments, the dielectric stack may have a thickness of between 100 nm and 500 nm, between 200 nm and 400 nm, between 250 nm and 350 nm, or approximately 310 nm. In some embodiments, a photoactive layer (e.g., the PbS layer in the illustrative VFET device shown in FIG. 4) may have a thickness between 60 nm and 240 nm, such as between 100 nm and 150 nm, such as 120 nm.

FIG. 5(e) illustrates the photocurrent gain mechanism which is an important part of the operation. Under a positive gate bias with IR illumination, the photo-generated holes in the PbS layer are accumulated at the PbS/$HfO_2$ interface while the photo-generated electrons in the PbS layer are transported through the ZnO layer to the ITO gate electrode. The accumulated holes at the PbS/$HfO_2$ interface significantly increase the field-effect due to an extremely thin effective gate dielectric layer (50 nm, $HfO_2$) compared to the effective thick gate dielectric stack (ZnO+PbS+$HfO_2$) when the device is operated in the dark. This strong field-effect results in strong band bending of the $C_{60}$ layer, thus leading to a significant narrowing of the lateral ITO/$C_{60}$ Schottky barrier width and electron injection at the porous ITO/$C_{60}$ interface, and hence a high photocurrent gain in the device.

Example

In accordance with some embodiments, FIGS. 6a-b and FIGS. 7a-b depict properties of an illustrative VFET. The description below of these figures, including discussion of properties of this illustrative VFET are provided as an example and are not limiting with respect to the characteristics of a VFET as described above.

Figure 6A:
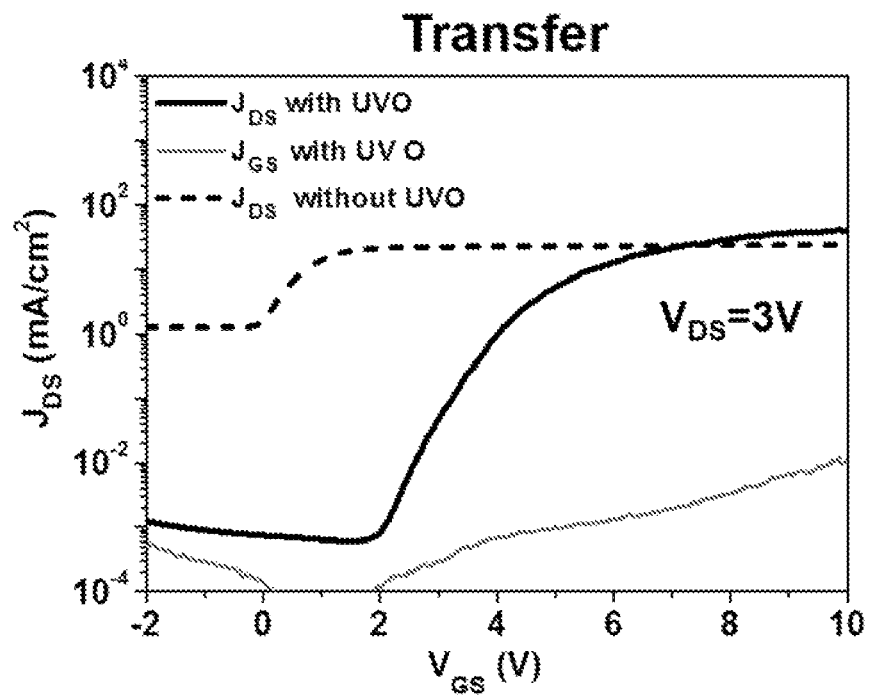
FIGS. 6(a)-6(b) depict a transfer curve and an output curve, respectively, of an illustrative vertical field effect transistor, according to some embodiments.
Figure 6B:
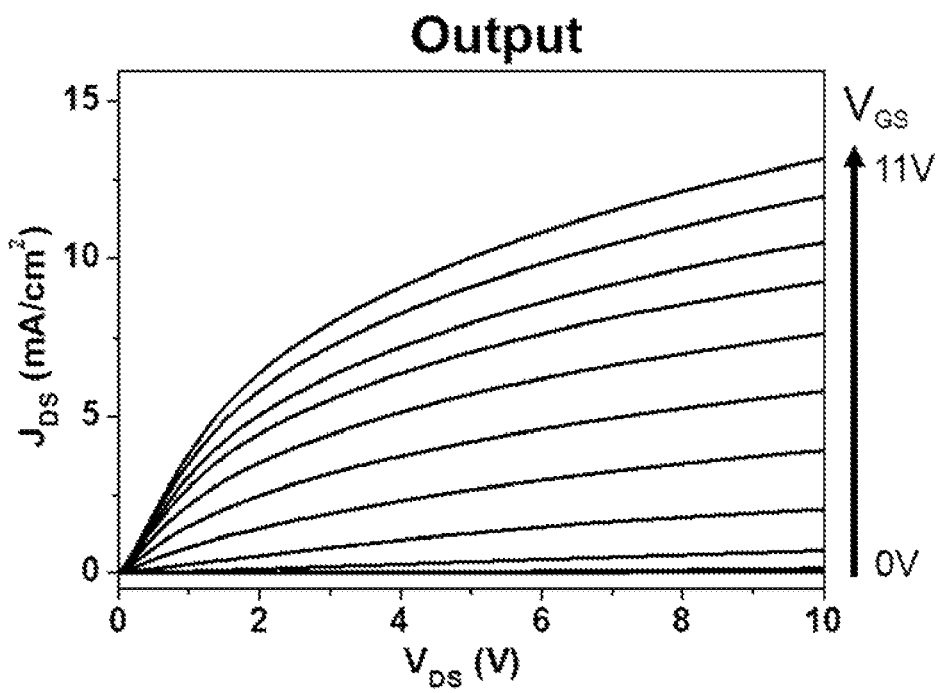

FIG. 6(a) shows the transfer curve of the transistor. The device without UV-ozone treatment on the porous ITO source electrode has a lower Schottky barrier and the off current is not suppressed leading to the low on/off ratio. After UV-ozone treatment, the off current decreases by three orders of magnitude due to the increased work-function of the porous ITO source electrode. It is noted that the on current is the same because it is a space-charge-limited current in the $C_{60}$ channel layer. FIG. 6(b) shows the output curve of the transistor representing saturated output current due to the space-charge-effect.

According to some embodiments, by incorporating an organic light-emitting diode in the channel of the vertical transistor, a vertical light-emitting field-effect transistor (VLET) is demonstrated. The VLET has following structure: Al (drain electrode)/$MoO_x$(hole injection layer)/4,4'-bis[N-(1-napthyl)-N-phenyl-amino] biphenyl (NPB, hole transporting layer)/4,48,49-tri(N-carbazolyl) triphenylamine (TCTA, emission layer)/4,7-diphenyl-1,10-phenanthroline (Bphen, electron transporting layer)/$C_{60}$(channel layer)/porous ITO(source electrode)/$HfO_2$(gate dielectric/ITO(gate electrode). The TCTA emission layer is doped with 9% volume of fac tris(2-phenylpyridine)iridium [Ir(ppy)$_3$] as a phosphorescent dye.

Figure 7A:
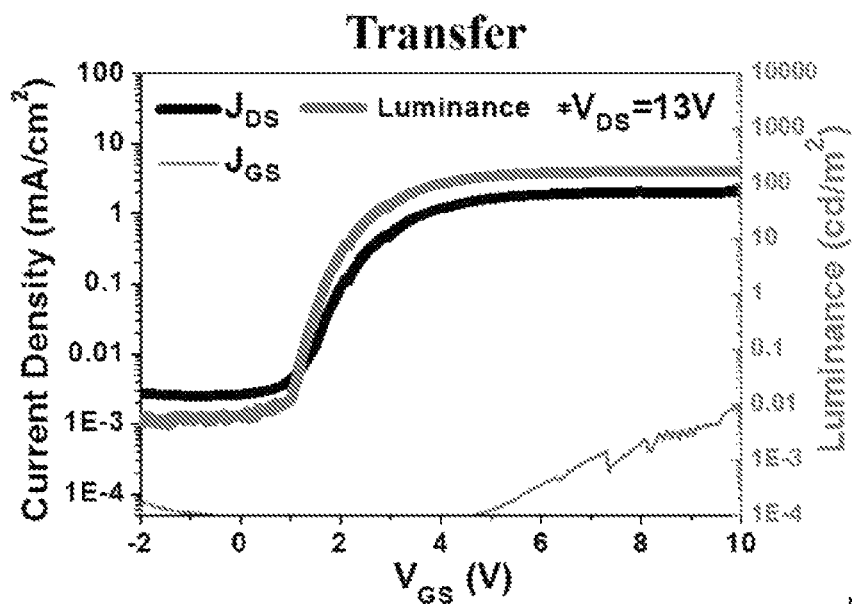
FIGS. 7(a)-7(b) depict a luminance transfer curve and a luminance output curve, respectively, according to some embodiments.
Figure 7B:
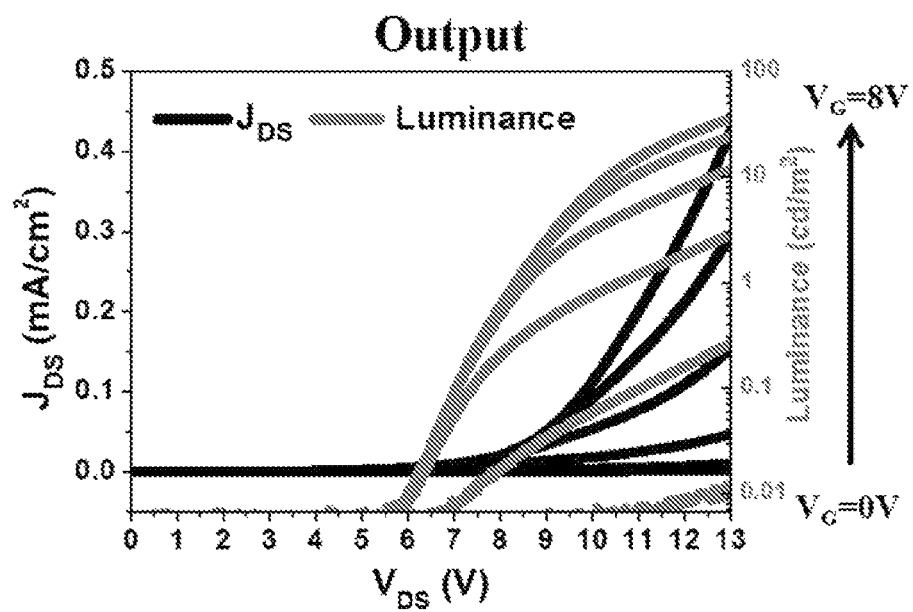

FIG. 7(a) shows the luminance transfer curve of a VLET as function of gate voltage. The current transfer curve (black line) is given for comparison with the luminance transfer curve (red line), showing the same turn-on gate voltage. FIG. 7(b) shows the luminance output curve of the VLET.

Manufacturing Techniques

Following below are illustrative manufacturing techniques for a VFET device as described above. It will be appreciated that these techniques are provided merely as examples and are non-limiting with respect to both the VFET device and methods of manufacture of a VFET. As discussed above, the VFET may optionally include a photoactive layer, and accordingly only some of the illustrative manufacturing techniques described below may be applicable to a particular embodiments of the VFET device, depending on whether the VFET includes the photoactive layer.

1. Synthesis of ZnO Nanocrystals and PbS Nanocrystals

ZnO Nanocrystal Synthesis and Spin-Coating Procedure:

0.6585 g of zinc acetate dihydrate (ZnAc, 98+%, ACROS organics) and 30 ml of dimethyl sulfoxide (Fisher Scientific) were stirred together in a flask at a speed of 475 rpm under room temperature. In another flask, 0.6 g of tetramethylammonium hydroxide (>97%, Sigma Aldrich) and 30 ml of ethyl alcohol were mixed by shaking for 2 minutes. Then, the solvents in both flasks were put together and stirred at a speed of 625 rpm for 50 minutes. Next, the solvents were divided into six centrifuge tubes by amount of 10 ml. 20 ml of ethyl acetate and 20 ml of heptane were added to each tube which was then centrifuged at a speed of 7000 rpm under 20° C. for 6 minutes. Following the centrifuging process, the supernatant solvent was removed and 6 ml of ethanol was added to each tube to make a ZnO precursor solution. Then, the ZnO solution was diluted by adding ethanol with 2:3 solution-to-ethanol volume ratio. The diluted ZnO solution was spin-coated on ITO substrate at a speed of 2000 rpm for 1 sec (1st step), 4000 rpm for 1 sec (2nd step), and 5000 rpm for 40 sec (3rd step). Immediately after the spin-coating, the substrate was put on a hot plate for a heat treatment at 80° C. for 10 minutes. Finally, UV curing ($\lambda$=365 nm) was applied for 30 sec in a glove box with oxygen and moisture concentration below 1 ppm.

PbS Nanocrystal Synthesis and Spin-Coating Procedure:

0.7 g of lead(II) oxide (99.999%, metal basis, Puratronic), 50 ml of 1-octadecene (90%, Sigma Aldrich), and 4 ml of oleic acid (90%, Sigma Aldrich) were put into a 100 ml 3-neck flask and stirred on a hot plate until the temperature reached 110° C. One neck of the flask was connected to a condenser to allow Ar gas flow into the flask, and the other was connected to a thermocouple to monitor the temperature, while the middle neck was capped with a rubber. When the temperature reached 110° C., 10 ml of 1-octadecene and 360 μl of hexamethyldisilathiane (synthesis grade, Sigma Aldrich) were mixed and poured into the flask. After 4 minutes, the solvents in the flask were quenched into a beaker containing 150 ml of isopropanol.

The solvents were divided into six centrifuge tubes by amount of 35 ml and then centrifuged at a speed of 7000 rpm under 25° C. for 20 minutes. After pouring the supernatant solution, 7.5 ml of toluene was added to each tube and the tube was shook by vortex. After pouring acetone to make each tube the same weight and the volume of 37.5 ml, 2nd centrifuge step was applied at a speed of 7000 rpm under 25° C. for 5 minutes. After pouring the supernatant solution, 7.5 ml of toluene was added to each tube and the tube was shook by vortex. Next, methanol was poured in each tube to make the same weight and volume of 35 ml, and 3rd centrifuge step was applied at a speed of 11,000 rpm under 25° C. for 10 minutes. After pouring the supernatant solution, all tubes were dried in a vacuum chamber for 2 hours. Then, 3 ml of chloroform was added to each tube and all tubes were dried again in a vacuum chamber overnight.

30 mg/ml of the PbS precursor powder in chloroform was prepared and the solution was spin coated on ZnO/ITO substrate at a speed of 2,000 rpm for 1 sec ($1^{st}$ step) and 2,500 rpm for 10 sec ($2^{nd}$ step). Next, 22.4 μl of benzene-1,3-dithiol (BDT) mixed with 20 ml of Acetonitrile was dropped on the PbS film with a wait time for 10 sec to exchange the oleic acid ligand with the BDT ligand. Immediately after the 10 sec, the same spin-coating steps as explained in the PbS spin-coating process was applied. Finally, Acetonitrile was spin-coated with the same spin-coating steps as explained in the PbS spin-coating process to clean the un-exchanged ligands on the surface. Counting all above processes as '1 layer' coating, we applied 1~5 layer coating of PbS film.

2. Fabrication of Porous ITO Electrode

Poly-Styrene Monolayer Formation:

1 ml of poly-styrene particle suspension (1.1 μm mean size, LB11, Sigma Aldrich) was mixed with 10 ml of deionized water and the solution was centrifuged at a speed of 8,000 rpm under 20° C. for 20 minutes. After pouring the supernatant water, 10 ml of ethanol was added and the solution was centrifuged with the above condition. After pouring the supernatant ethanol, 4 ml of ethylene glycol was added and stirred by a rod ultra-sonicator.

Next, $HfO_2$/PbS/ZnO/ITO substrate was dipped in a full water beaker. Then, the polystyrene-ethylene glycol precursor solution was dropped by a pipette on top of the water to make the water surface covered by a monolayer of polystyrene spheres. Using a syringe pump (KDS200, KD Scientific), the substrate was slowly pulled up at a speed of 400 μl/min while pushing the polystyrene monolayer toward the substrate by dropping sodium dodecyl sulfate (Sigma Aldrich) on the water surface.

Figure 8:
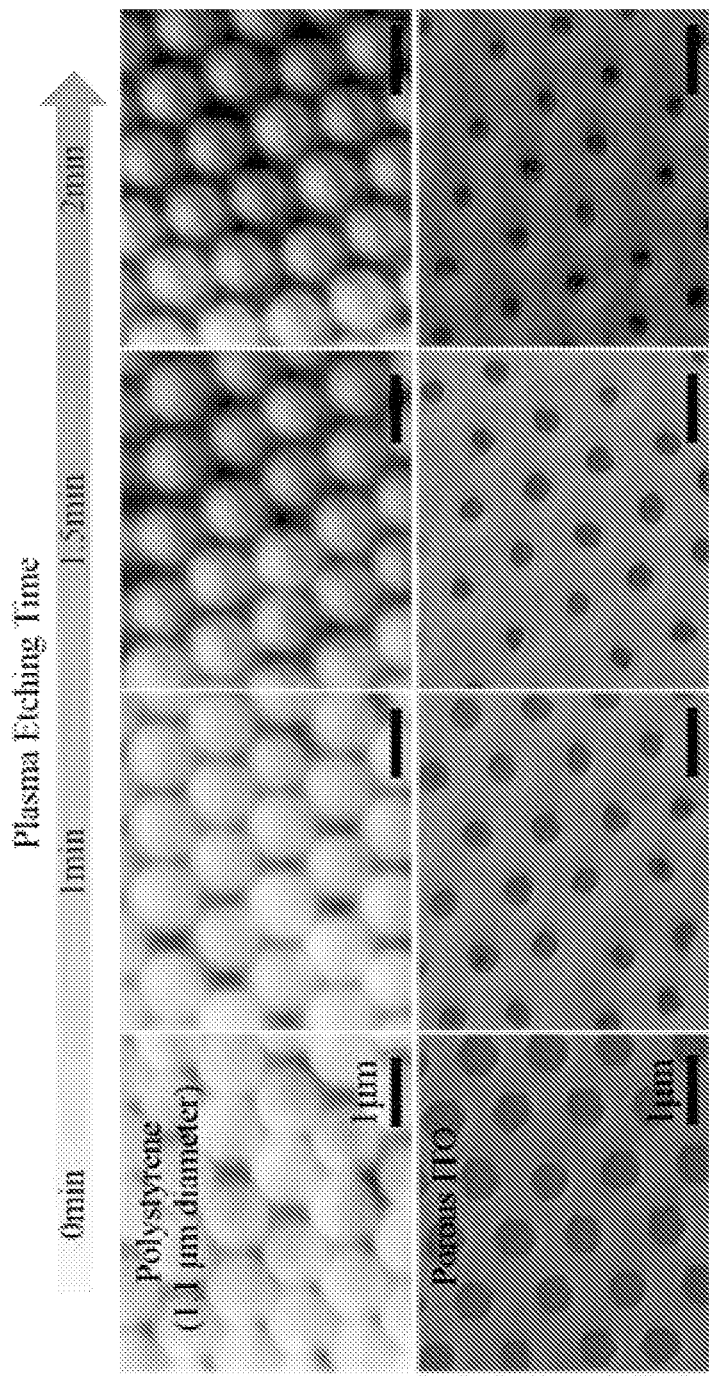
FIG. 8 illustrates pore size control by oxygen plasma etching time, according to some embodiments.

FIG. 8 illustrates pore size control by oxygen plasma. After a monolayer formation on the substrate, the polystyrene particle size was controlled by a reactive ion etching (Unaxis, RIE power=100 W, $O_2$ pressure=40 mTorr, chamber pressure=40 mTorr) for 0~2 minutes. Polystyrene size is important because it will become the ITO pore size at the end. For optimum condition, 1 or 2 minutes of RIE etching time was applied.

Porous ITO Fabrication:

After controlling the polystyrene size by RIE process, the substrate was moved into a sputter chamber. 45 nm-thick ITO film was sputtered on the substrate at a deposition rate of 1 Å/s under 50 sccm of Ar flow and 7 sccm of $O_2$ flow at 150 W of DC sputter power. While in the sputter process, a shadow metal mask was used to define the porous ITO pattern. After the sputtering process, the polystyrene monolayer on the substrate was removed by tape leaving a porous ITO pattern solely on the substrate as shown in FIG. 8.

3. Device Fabrication

Fabrication of VFET:

Patterned ITO glass was cleaned using acetone and isopropanol in ultrasonic bath for 15 min respectively, followed by a UV-ozone treatment for 30 minutes. Solution-processed ZnO nanocrystal film was spin-coated in the air on top of the ITO glass substrate followed by a heat treatment at 80° C. for 15 minutes. PbS quantum-dot nanocrystals were synthesized with a peak absorption wavelength lying at 1,046 nm by treating 1,3-benezendithiol (BDT) as the surface ligands during the spin-coating process as explained in the previous section. For an optimum thickness, spin coating of PbS film was performed four times to give 240 nm PbS film thickness. Next, 50 nm-thick $HfO_2$ gate dielectric was deposited on top of the PbS layer by atomic layer deposition (Cambridge Nano Fiji 200, chamber temperature=80° C., deposition rate=1 Å per cycle, # of cycles=500). After a porous ITO source electrode was fabricated as explained in the previous section, the porous ITO/$HfO_2$/PbS/ZnO/ITO sample was UV-ozone-treated for 30 minutes to increase the work-function of the porous ITO electrode. Following the UV treatment, the sample was moved into a thermal evaporating chamber (Kurt J. Lesker company) and 1 µm-thick $C_{60}$ channel layer (99.5%, M.E.R corporation) was deposited in order to avoid any current short path in the $C_{60}$ channel. For the top drain electrode, 100 nm-thick Al film was deposited.

Device Characterization:

Electrical characteristics were measured using Keithley 4200. For luminance-current-voltage (LIV) characteristics, a calibrated Si photodiode (Newport, Responsivity=0.34 A/W at 550 nm wavelength) connected to the Keithley 4200 was used to measure the photocurrent. A 150 W ozone free xenon DC arc lamp coupled with an ORIEL 74125 monochromator was used to generate a monochromatic infrared light. The IR intensity was controlled by using a neutral density filters and a diffuser. All devices were encapsulated in a glove box with both $O_2$ and moisture levels below 1 ppm, and the measurements were performed at room temperature under ambient atmosphere.

4. IR Power Dependence of VFET

Figure 9:
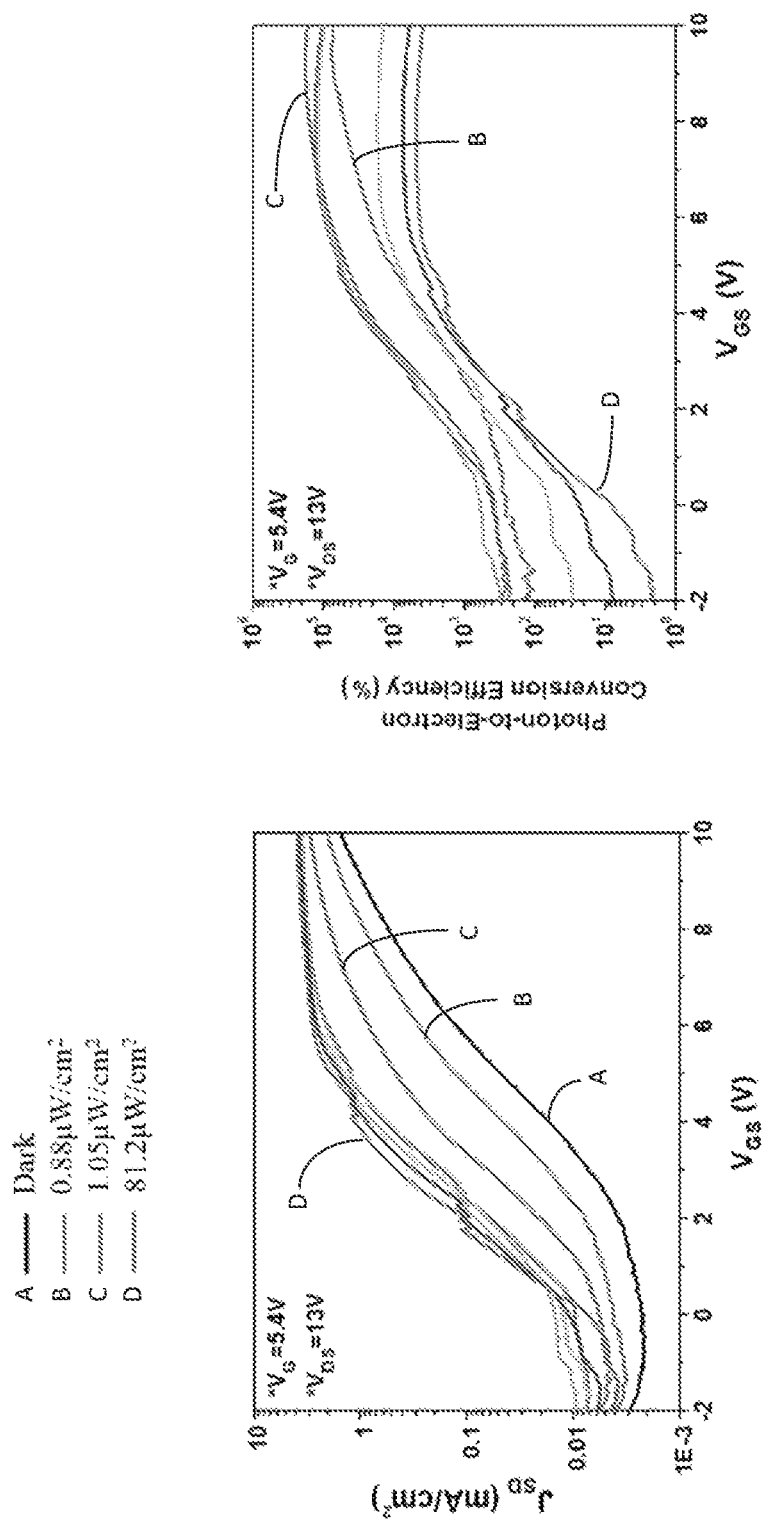
FIG. 9 illustrates current and photon-to-electron conversion efficiency of a vertical phototransistor as a function of gate bias, according to some embodiments.

FIG. 9 illustrates the power dependence of a VFET. Transfer curves with different IR power density from 0.88 µW/cm² to 81.2 µW/cm² are plotted in FIG. 9 (left). In order to maximize the EQE, high $V_{DS}$(=13V) was applied. In FIG. 9, illustrative curves A, B, C, and D are labeled corresponding to no photocurrent (dark), 0.88 µW/cm², 1.05 µW/cm², and 81.2 µW/cm², respectively.

5. Effect of PbS Thickness

Figure 10:
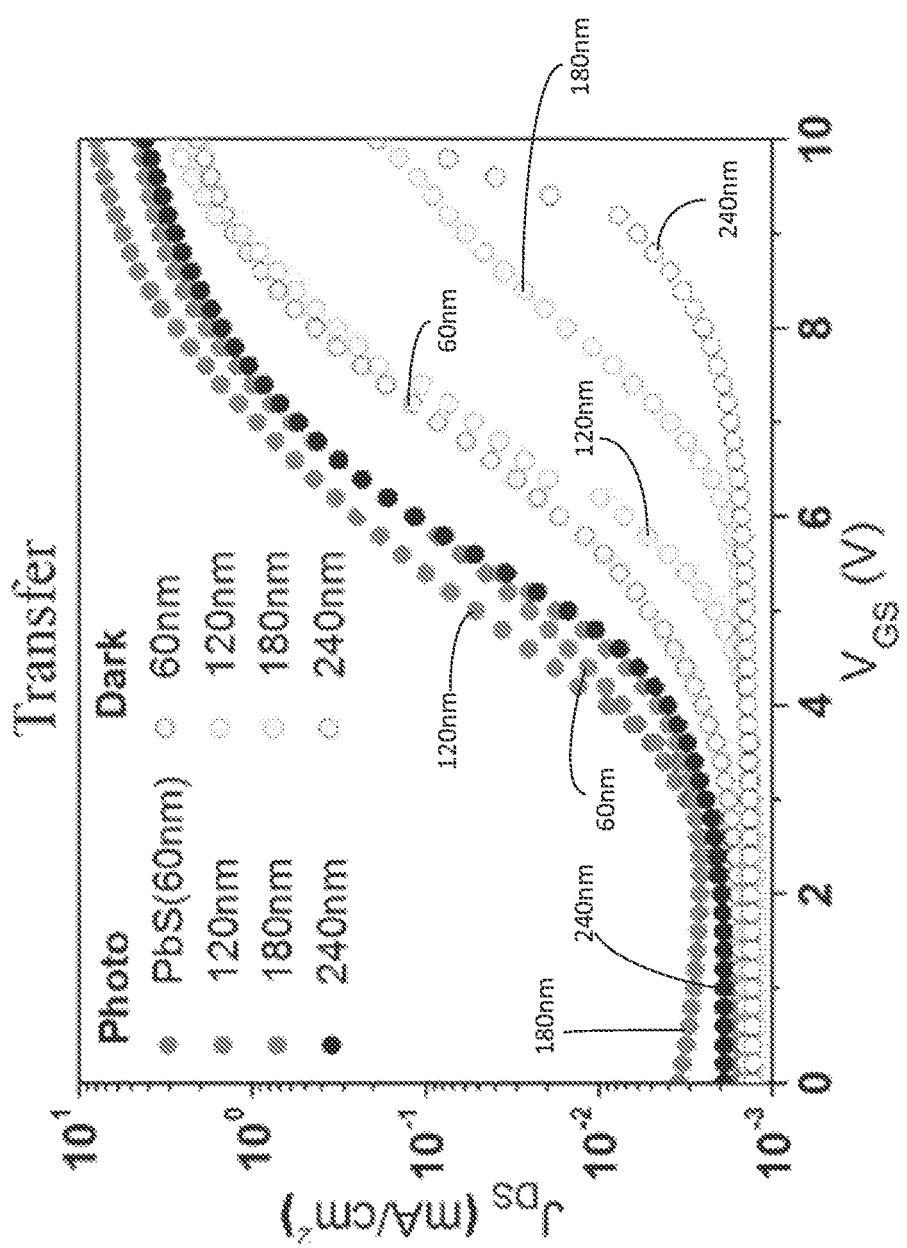
FIG. 10 depicts the effect of PbS thickness on device operation window, according to some embodiments.

FIG. 10 depicts the effect of PbS thickness on device operation window. PbS thickness was controlled by the number of PbS spin-coating process. As observed, thicker PbS film may demand a higher gate voltage to turn on the dark transfer curve. In addition, IR absorption in the thicker PbS film is larger than the absorption in thinner PbS film, leading to larger threshold voltage shift under IR illumination. As a result, wider device operation window was observed in the device with 240 nm-thick PbS layer.

6. Effect of Source-Drain Voltage ($V_{DS}$)

Figure 11:
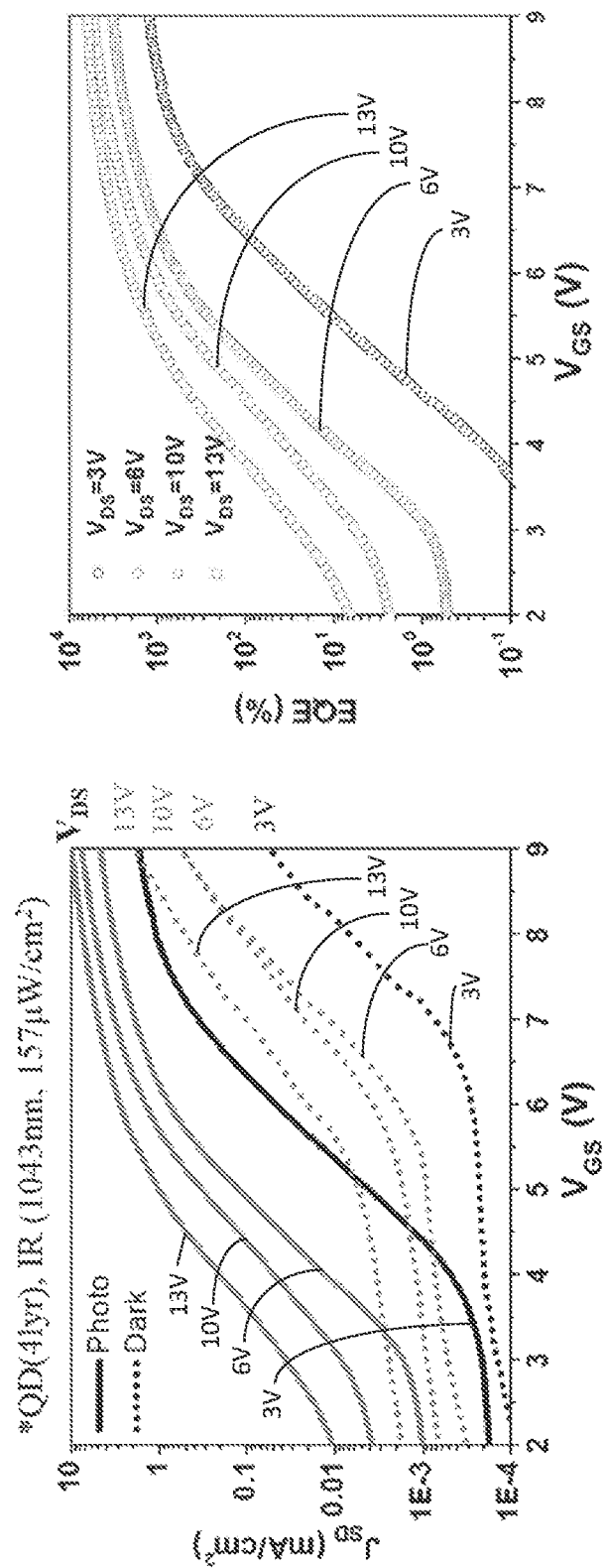
FIG. 11 illustrates the effect of $V_{DS}$ on external quantum efficiency (EQE), according to some embodiments.

FIG. 11 illustrates the effect of $V_{DS}$ on EQE. Effect of $V_{DS}$ (3 V, 6 V, 10 V, and 13 V) on EQE was examined. Relatively stronger IR power density (157 µW/cm²) was applied to demonstrate the big change in EQE as function of $V_{DS}$.

7. Reproducibility of VFET

Figure 12:
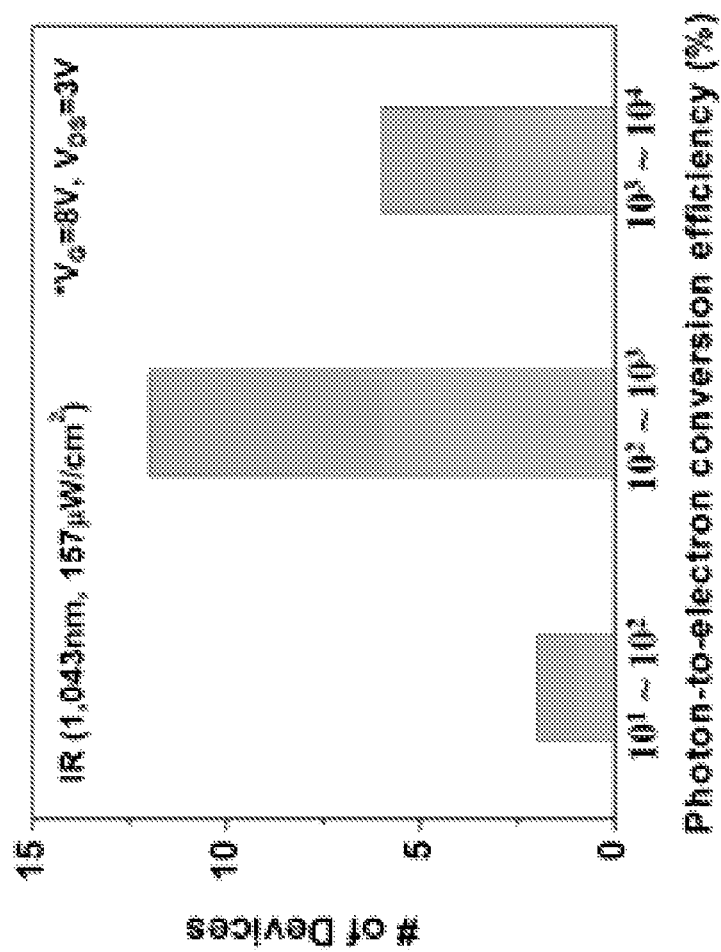
FIG. 12 illustrates reproducibility of the vertical phototransistor, according to some embodiments.

FIG. 12 illustrates reproducibility of a photosensitive VFET. 20 IR photosensitive VFET devices were fabricated in the exactly same condition, and the EQEs were measured at $V_{GS}$=8V and $V_{DS}$=3V for each device. Strong IR power density (157 µW/cm²) was applied in the measurement, and 18 out of 20 devices exhibited gain EQEs.

8. Detectivity Measurement of the VFET

Detectivity, D*, is expressed by the following equation (1).

$$D^* = (A\Delta f)^{1/2} R/i_n \quad (1)$$

where A is the device area, $\Delta f$ is bandwidth in Hz, R is responsivity in A/W, $i_n$ is the noise current in ampere. R is expressed by $$R = EQE \times \left(\frac{q}{hv}\right) \quad (2)$$

where q is the electronic charge, h is the Planck constant, and v is the frequency of the incident photon. The noise current was measured under electrically and optically shielded environment using a Stanford Research SR830 lock-in amplifier and a SR570 low noise preamplifier (2). The lock-in frequency of the noise current was set to be 30 Hz during the measurements. For a voltage supply, alkaline batteries were used to minimize a noise. For a VFET employing 240 nm-thick PbS film, we observed a high detectivity of 1.23× $10^{13}$ jones at $V_{GS}$=3.5V and $V_{DS}$=13V, which is comparable with the detectivity of a commercial InGaAs photodiode (3).

9. RC Measurement of the VFET

Figure 13:
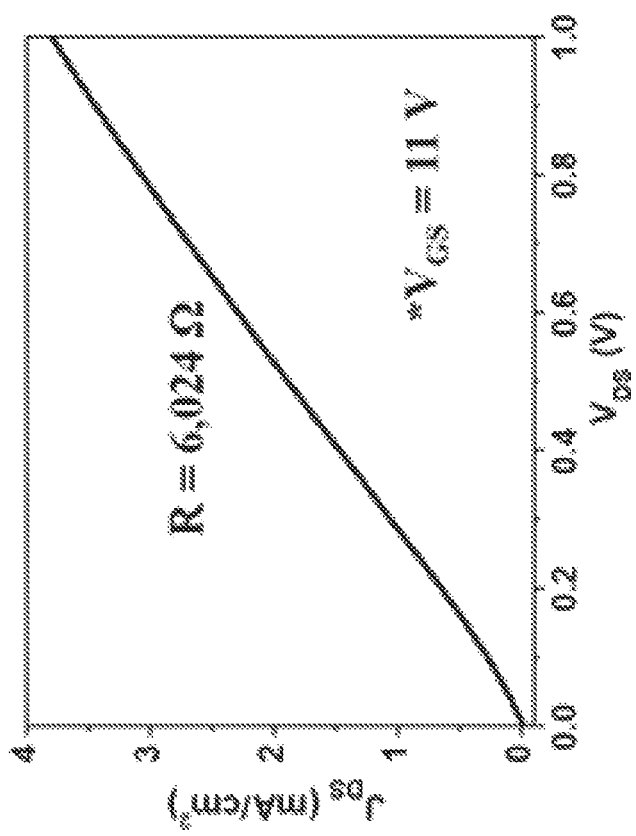
FIG. 13 illustrates source-drain current of a vertical IR phototransistor as a function of source-drain bias, according to some embodiments.

FIG. 13 illustrates an example of source-drain current of a VFET as a function of source-drain bias. The resistance of the $C_{60}$ layer in the VFET was measured at $V_{GS}$=11 V with sweeping $V_{DS}$ at low voltages. Due to the high $V_{GS}$ and low $V_{DS}$, the source-drain current follows Ohm's law enabling calculation of the resistance of the $C_{60}$ layer to be 6,024Ω. If the resistance is calculated from the universal resistivity of $C_{60}$ (1,014 Ω/m), the resistance should be 250Ω which is almost 24 times lower than the measured resistivity of the $C_{60}$ layer in our VFET. The huge difference in the resistance attributes to the contact resistance at the top Al drain electrode. Since the total capacitance of the VFET was measured to be 1.6 nF at $V_{DS}$=7 V and $V_{GS}$=6 V, the calculated RC constant from the RC measurement was 9.6 µs corresponding to a cut-off frequency of 17 kHz.

REFERENCES

The following references are incorporated herein by reference in their entireties:

Chen, J. et al. Hybrid Organic/Inorganic Optical Up-Converter for Pixel-Less Near-Infrared Imaging. Adv Mater 24, 3138-3142 (2012).

Allard, L., Liu, H., Buchanan, M. & Wasilewski, Z. Pixelless infrared imaging utilizing a p-type quantum well infrared photodetector integrated with a light emitting diode. Appl Phys Lett 70, 2784-2786 (1997).

Kim, D. Y., Song, D. W., Chopra, N., De Somer, P. & So, F. Organic Infrared Upconversion Device. Adv Mater 22, 2260 (2010).

Kim, D. Y. et al. PbSe Nanocrystal-Based Infrared-to-Visible Up-Conversion Device. Nano Lett 11, 2109-2113 (2011).

Kim, D. Y. Lai, T.-H., Lee, J. W., Manders, J. R. & So, F. Multi-spectral imaging with infrared sensitive organic light emitting diode. Scientific reports 4 (2014).

Campbell, I. H. & Crone, B. K. A near infrared organic photodiode with gain at low bias voltage. Appl Phys Lett 95, 263302-263302-263303 (2009).

Sun, Z. et al. Infrared Photodetectors Based on CVD-Grown Graphene and PbS Quantum Dots with Ultrahigh Responsivity. Adv Mater 24, 5878-5883 (2012).

Konstantatos, G. et al. Ultrasensitive solution-cast quantum dot photodetectors. Nature 442, 180-183 (2006).

Konstantatos, G. et al. Hybrid graphene-quantum dot phototransistors with ultrahigh gain. Nat Nanotechnol 7, 363-368 (2012).

Peumans, P. & Forrest, S. R. Very-high-efficiency double-heterostructure copper phthalocyanine/C-60 photovoltaic cells. Appl Phys Lett 79, 126-128 (2001).

Luo, H., Ban, D., Liu, H. C., Wasilewski, Z. R. & Buchanan, M. Optical upconverter with integrated heterojunction phototransistor and light-emitting diode. Appl Phys Lett 88 (2006).

G. He, M. Pfeiffer, K. Leo, M. Hofmann, J. Birnstock, R. Pudzich, J. Salbeck, High-efficiency and low-voltage p-i-n electrophosphorescent organic light-emitting diodes with double-emission layers. Appl Phys Lett 85, 3911-3913 (2004).

Having thus described several aspects of at least one embodiment of this invention, it is to be appreciated that various alterations, modifications, and improvements will readily occur to those skilled in the art. Such alterations, modifications, and improvements are intended to be part of this disclosure, and are intended to be within the spirit and scope of the invention. Further, though advantages of the present invention are indicated, it should be appreciated that not every embodiment of the technology described herein will include every described advantage. Some embodiments may not implement any features described as advantageous herein and in some instances one or more of the described features may be implemented to achieve further embodiments. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

The invention claimed is:

1. A vertical field-effect transistor, comprising:
   a first electrode;
   a porous conductor layer formed from a layer of conductive material with a plurality of holes extending through the conductive material disposed therein, wherein a fraction of the surface area of the porous conductor layer in which holes of the plurality of holes are present is between 40% and 60%;
   a dielectric layer between the first electrode and the porous conductor layer;
   a charge transport layer in contact with the porous conductor layer; and
   a second electrode electrically connected to the charge transport layer.

2. The vertical field-effect transistor of claim 1, wherein the plurality of holes each have a diameter between 0.5 μm and 2 μm.

3. The vertical field-effect transistor of claim 1, wherein the conductive material is transparent.

4. The vertical field-effect transistor of claim 1, wherein the conductive material is a transparent conductor or a transparent doped semiconductor.

5. The vertical field-effect transistor of claim 4, wherein the conductive material is indium tin oxide (ITO).

6. The vertical field-effect transistor of claim 1, further comprising electrical connections coupled to each of the first electrode, porous conductor layer and second electrode.

7. The vertical field-effect transistor of claim 1, wherein the charge transport layer comprises fullerene.

8. The vertical field-effect transistor of claim 1, further comprising a photoactive layer between the dielectric layer and the first electrode.

9. The vertical field-effect transistor of claim 8, wherein the photoactive layer comprises one or more of: lead sulfide, silver sulfide and silver selenide.

10. The vertical field-effect transistor of claim 8, wherein the photoactive layer comprises nanocrystals.

11. The vertical field-effect transistor of claim 8, further comprising a hole blocking layer between the photoactive layer and an electrode, the electrode electrically connected to the porous conductor layer.

12. The vertical field-effect transistor of claim 11, wherein the hole blocking layer comprises one or more of: titanium dioxide, zinc oxide and zinc sulfide.

13. The vertical field-effect transistor of claim 11, wherein the hole blocking layer comprises nanocrystals.

14. The vertical field-effect transistor of claim 1, wherein the dielectric layer comprises a high-K dielectric.

15. The vertical field-effect transistor of claim 14, wherein the dielectric layer comprises hafnium oxide.

16. The vertical field-effect transistor of claim 1, wherein the charge transport layer has a work function that is higher than a work function of the porous conductor layer.

17. A method of manufacturing a vertical field-effect transistor, the method comprising:
    forming a dielectric layer; and
    depositing a conductor layer over the dielectric layer, wherein one or more regions of the dielectric layer are masked during deposition such that the conductor layer includes a plurality of pores that extend through the conductor layer; and
    performing a UV-ozone treatment of the conductor layer.

18. The method of claim 17, wherein the holes each have a diameter between 0.1 μm and 10 μm.

19. The method of claim 17, wherein the conductor layer is formed via sputtering.

20. A vertical field-effect transistor, comprising:
    a first electrode;
    a porous conductor layer formed from a layer of conductive material with a plurality of holes extending through the conductive material disposed therein, wherein the plurality of holes each have a diameter between 0.5 μm and 2 μm;
    a dielectric layer between the first electrode and the porous conductor layer;
    a charge transport layer in contact with the porous conductor layer; and
    a second electrode electrically connected to the charge transport layer.

21. The vertical field-effect transistor of claim 20, wherein the charge transport layer comprises fullerene.

22. The vertical field-effect transistor of claim 20, wherein the dielectric layer comprises hafnium oxide.

* * * * *